(12) United States Patent
Kim et al.

(10) Patent No.: US 6,323,788 B1
(45) Date of Patent: Nov. 27, 2001

(54) INTERLEAVING APPARATUS AND METHOD FOR USE IN SERIAL CONCATENATED CONVOLUTIONAL CODE ENCODER IN A MOBILE COMMUNICATION SYSTEM

(75) Inventors: Beong-Jo Kim, Songnam; Min-Goo Kim, Suwon; Young-Hwan Lee, Songnam; Se-Hyoung Kim, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/576,374

(22) Filed: May 22, 2000

(30) Foreign Application Priority Data

May 20, 1999 (KR) .................................................. 99-19095

(51) Int. Cl.[7] ........................................................ G06F 11/00
(52) U.S. Cl. .............................................. 341/81; 714/701
(58) Field of Search ............................... 341/81; 714/701, 714/755, 786

(56) References Cited

U.S. PATENT DOCUMENTS

| | | | |
|---|---|---|---|
| 6,151,690 | * | 11/2000 | Peeters .................................. 714/701 |
| 6,192,493 | * | 2/2001 | Combelles et al. ................... 714/701 |
| 6,201,838 | * | 3/2001 | Kim ...................................... 375/341 |

* cited by examiner

Primary Examiner—Tuan T. Lam
(74) Attorney, Agent, or Firm—Dilworth & Barrese, LLP

(57) ABSTRACT

An interleaver for a serial concatenated convolutional code (SCCC) encoder is disclosed. The interleaver has a memory with m row groups and n column groups, and the memory stores serial input symbols in the groups. The interleaver randomly selects one of the m row groups, then randomly selects one of the positions in the selected row, then outputs the symbol stored in the selected position in the selected row so as to generate interleaved symbols. The SCCC encoder includes a component encoder for encoding the interleaved symbols from the interleaver. The encoded codes of the component encoder have an effective free distance. When the number of the serial input symbols is k, the m row groups and n column groups in the memory are chosen such that $m \times n \geq k$, and m is larger than the effective free distance.

36 Claims, 11 Drawing Sheets

INTERLEAVING APPARATUS AND METHOD FOR USE IN SERIAL CONCATENATED CONVOLUTIONAL CODE ENCODER IN A MOBILE COMMUNICATION SYSTEM

PRIORITY

This application claims priority to an application entitled "Interleaving Apparatus and Method for Use in SCCC Encoder in Mobile Communication System" filed in the Korean Industrial Property Office on May 20, 1999 and assigned Serial No. 99-19095, the contents of which are hereby incorporated by reference.

BACKGROUND OF THE INVENTION

1. Field of the Invention

The present invention relates generally to an encoding/decoding apparatus in a mobile communication system, and in particular, to an interleaving apparatus and method for an encoder using a serial concatenated convolutional code (SCCC).

2. Description of the Related Art

In general, a W-CDMA (Wideband Code Division Multiple Access) or CDMA-2000 communication system requires data transmission at a low bit error rate (BER) ranging from $10^{-4}$ to $10^{-6}$, and requires a high data reliability in the situation where a signal-to-noise ratio (SNR) is relatively low in data transmission of a satellite system. To satisfy such requirements, most mobile communication systems encode and decode digital information to be transmitted over a wired or wireless link, using a parallel concatenated convolutional code (PCCC) or a turbo code for forward error correction. The use of PCCCs has improved performance as compared with existing convolutional code, and in particular, has superior performance when the SNR is low. Therefore, the PCCC has been adopted as the Forward Error Correction (FEC) technique for data communication in the IMT-2000 system and is the subject of active research.

Performance of the PCCC is determined according to SISO (Soft-In-Soft-Out) iterative decoding at a receiver, and an encoder using the PCCC (hereinafter, referred to as a PCCC encoder) has a characteristic which is dependent on two parallel-connected component encoders and a turbo interleaver connected between them. The component encoders commonly use a recursive systematic code (RSC). The PCCC has a longer free distance $d_{free}$ as compared with existing convolutional code.

On the other hand, an error correction code, which is obtained by directly connecting two or more error correction codes, has been typically used in systems which require a very low BER. For example, the provisional UMTS (Universal Mobile Telecommunication System) standard specifies that a serial concatenated convolutional code (SCCC) should be used for a BER of below $10^{-7}$.

FIG. 1 shows a structure of an encoding device that uses a SCCC (hereinafter, referred to as an SCCC encoder). In particular, FIG. 1 shows a 4-state SCCC encoder in which the component encoders have 4 states.

Referring to FIG. 1, the SCCC encoder includes two component encoders 10 and 40, and an interleaver 30 which connects them in series. Performance of the SCCC encoder is determined depending on performance of the component encoders 10 and 40 and the characteristics of the internal interleaver 30. If the component encoders are set as in the PCCC encoder, the total $d_{free}$ of the SCCC encoder will depend on the characteristics of the internal interleaver 30.

As a result, the characteristics of the internal interleaver 30 will determine the whole performance of the SCCC encoder. That is, if the component encoders 10 and 40 are given, the interleaver 30 becomes the unique factor which determines the whole performance of the system.

In FIG. 1, an outer encoder 10 encodes input information data $U^o$ and a multiplexer 50 converts the output of the outer encoder 10 in such a manner that two input bit streams are converted to one serial bit stream. Thereafter, a puncturer 20 receiving the output of the multiplexer 50, generates an outer code $C^o$ of rate 2/3. The generated outer code $C^o$ is provided to an inner encoder 40 as $U^i$ through the SCCC interleaver 30. The inner encoder 40 of rate 1/2 encodes $U^i$ to generate $C^i$, and a multiplexer 60 converts $C^i$ in such a manner that two input bit streams are converted to one serial bit stream, and transmits its output to a channel.

Conventionally, only the block interleaver or the PN (Pseudo Noise) interleaver was used as the interleaver of the SCCC encoder, on the assumption that the performance of the SCCC encoder has little dependence on the performance of the interleaver. That is, it was assumed that the performance would be guaranteed, if the distance and randomization of the preceding code are guaranteed for the following encoder. However, in order to optimize performance of the SCCC encoder comprised of two cascaded encoders, both the random property and the distance property should have been considered. But, such properties were conventionally overlooked. In other words, the fact was overlooked that, if the coded symbol distance was maintained while transmitting random code symbols, then consecutively generated errors could be fully corrected at the outer decoder.

Therefore, in order to optimize performance of an SCCC encoder, it is necessary to design an SCCC interleaver which satisfies both the distance property and the random property.

SUMMARY OF THE INVENTION

It is, therefore, an object of the present invention to provide an SCCC interleaving apparatus and method for optimizing performance of an SCCC encoder.

It is another object of the present invention to provide an SCCC interleaving apparatus and method which satisfies both a distance property and a random property in a component encoder.

It is further another object of the present invention to provide an SCCC interleaving apparatus and method which guarantees a low complexity while satisfying both the distance property and the random property in a component encoder.

To achieve the above and other objects, there is provided an interleaver for a serial concatenated convolutional code (SCCC) encoder. The SCCC encoder includes an interleaver having a memory with m row groups and n column groups, for storing serial input symbols in the groups, randomly selecting the m row groups and randomly selecting one of the symbols stored in said each selected row group so as to generate interleaved symbols; and an encoder for encoding the interleaved symbols from the interleaver, the encoder having an effective free distance of the encoded codes. When the number of the serial input symbols is k, the memory with m row groups and n column groups includes (m×n≥k) groups, and m is larger than the effective free distance.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
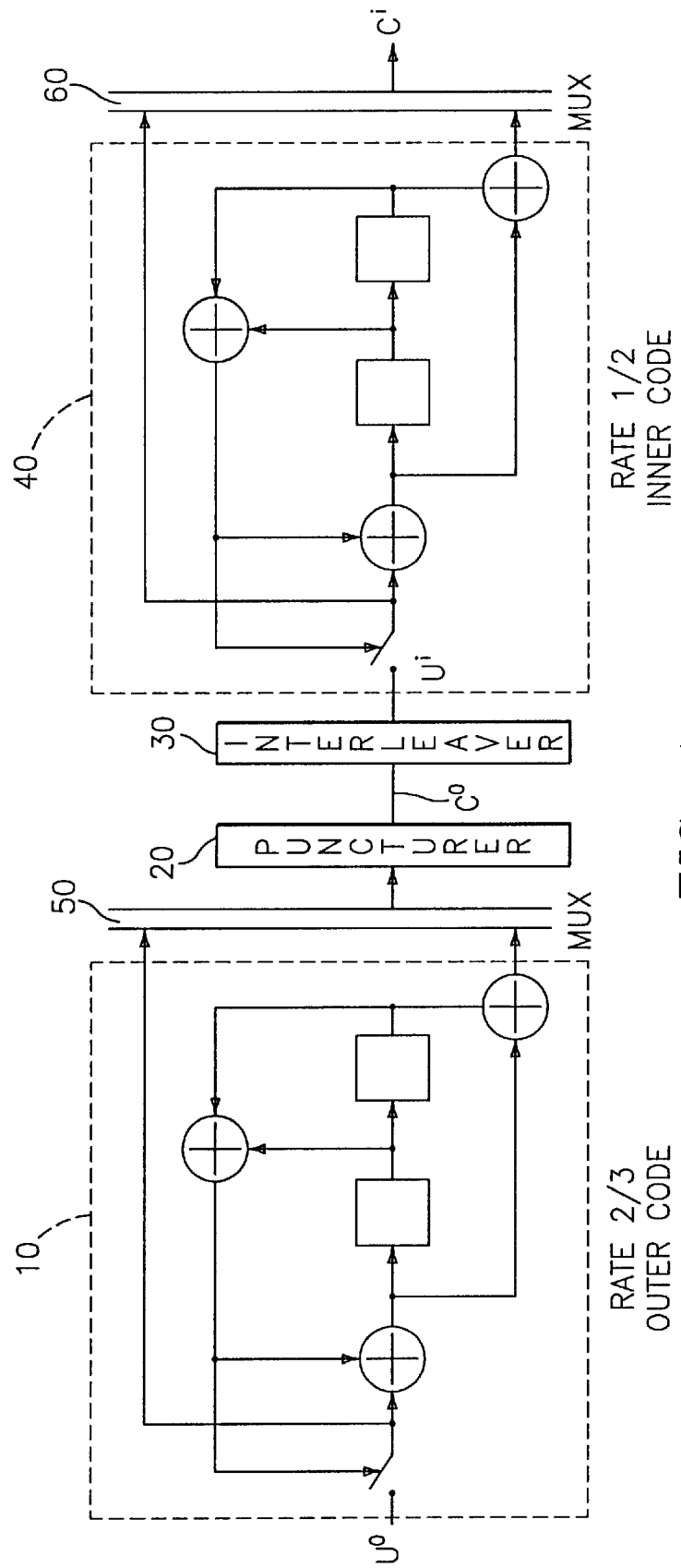
FIG. 1 is a diagram illustrating an SCCC encoder to which the present invention is applicable.
Figure 2:
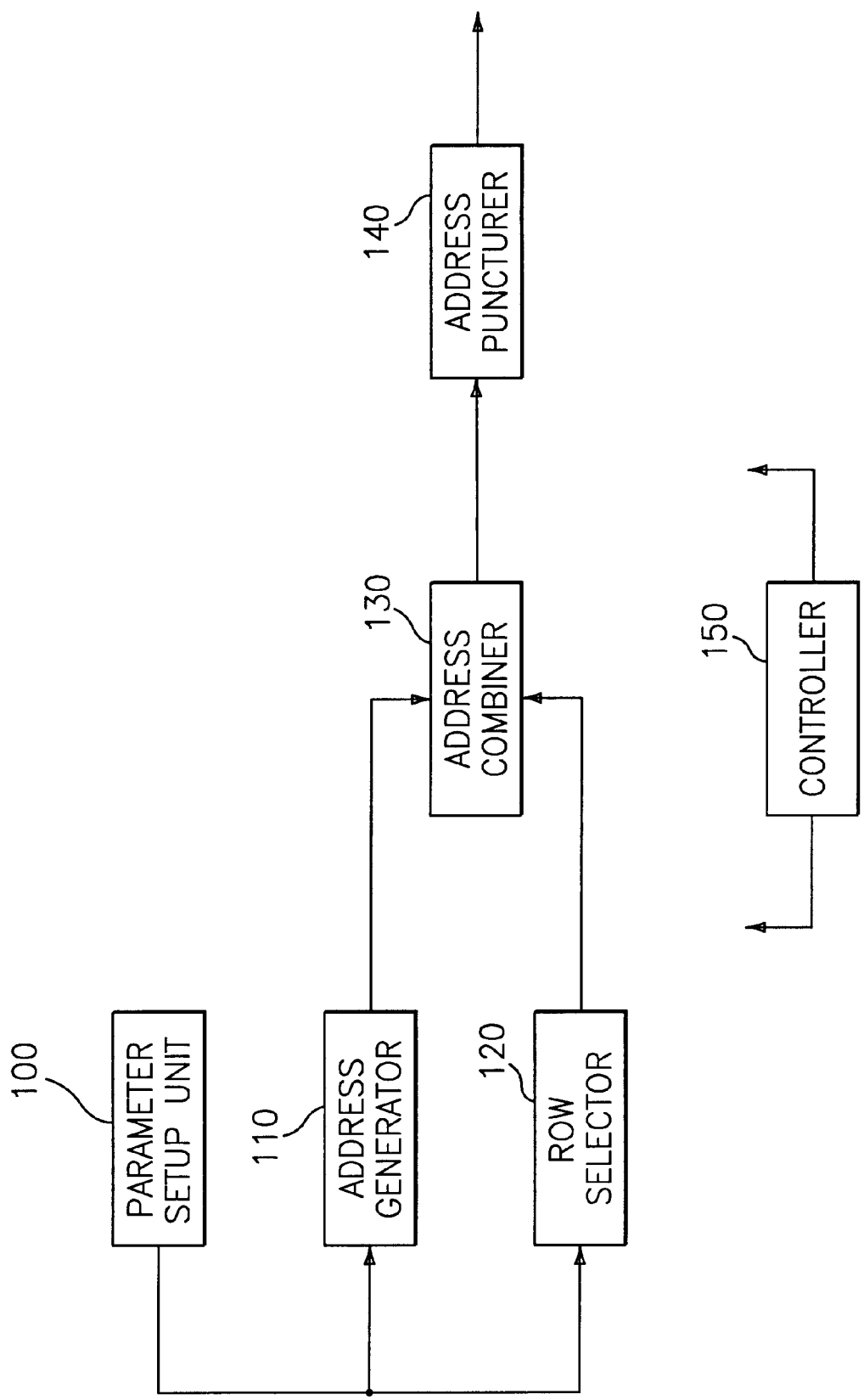
FIG. 2 is a diagram illustrating an SCCC interleaver according to an embodiment of the present invention.

FIG. 2 shows a structure of an SCCC interleaver according to an embodiment of the present invention. This interleaver is used as an internal interleaver of the SCCC encoder. That is, the above SCCC interleaver implements the interleaver 30, shown in FIG. 1, connected between the component encoders 10 and 40.

Referring to FIG. 2, a parameter setup unit 100 sets up rows and columns of a 2-dimensional array and other SCCC interleaver parameters from a given interleaver size. For example, when a PN shift register (PNSR) is used, the parameter setup unit 100 sets up an initial seed and a generator polynomial. Alternatively, when a linear recursive equation is used, the parameter setup unit 100 sets up an initial value and a prime number. The detailed setup parameters will be shown with reference to six embodiments which will be described later. An address generator 110 generates an interleaving rule or a base random address P(r,K) at each row. A row selector 120 multiplexes the respective rows (or groups). An address combiner 130 combines an output of the address generator 110 with an output of the row selector 120 to generate an address of data to be actually interleaved. An address puncturer 140 punctures an invalid address exceeding a preset interleaver size. A controller 150 controls the above elements. An address output from the address puncturer 140 is used as an address for interleaving the coded data stream output from the first component encoder 10 of FIG. 1, i.e., is used as an address for reading the stored coded data streams.

Now, if the interleaver size N is determined, the parameter setup unit 100 determines rows, columns, a row selecting rule and a parameter for address generation. Next, the row selector 120 selects a row r at every clock, and the address generator 110 generates a random address P(r,K) in the selected row. The address combiner 130 combines r with P(r,K) to generate an address for actual interleaving operation. If the generated address is an invalid address, the address puncturer 140 deletes or punctures the invalid address. This process is repeated until N addresses are all generated.

A description will now be made of the SCCC interleaver according to an embodiment of the present invention. First, it will be shown that the novel SCCC interleaver can be implemented by a 2-D (two-dimensional) SCCC interleaver. Next, it will be explained that the 2-D SCCC interleaver can be implemented in at least six embodiments. Thereafter, it will be shown that the novel 2-D SCCC interleaver has improved BER/FER (Bit Error Rate/Frame Error Rate) performance as compared with the conventional block interleaver or 1-D (1-dimensional) interleaver.

2-D SCCC interleaver.

Figure 3:
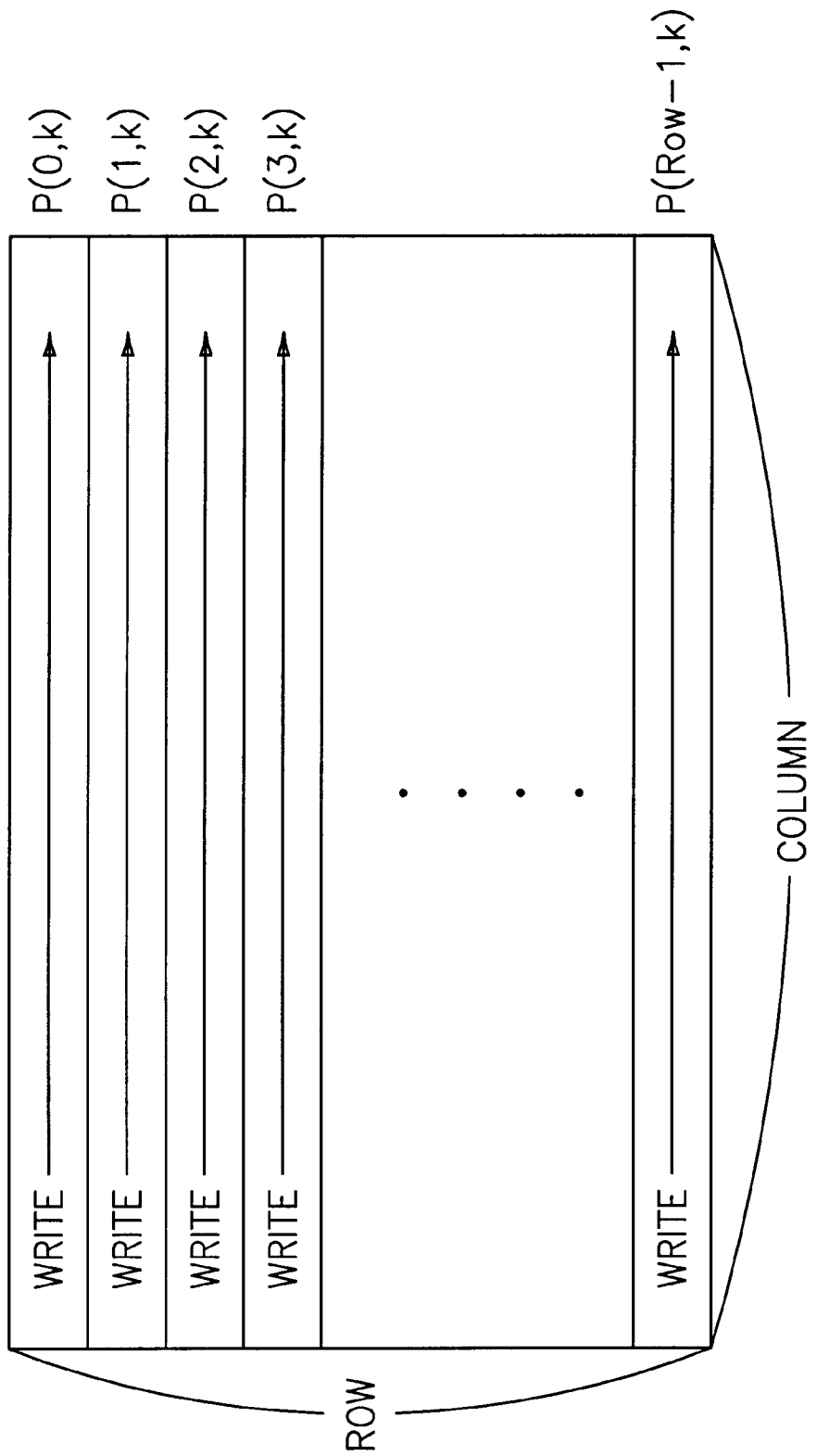
FIG. 3 is a diagram for explaining that the SCCC interleaver can be implemented by a 2-D SCCC interleaver.

When an input data size is given, a 2-D SCCC interleaver according to an embodiment of the present invention performs mapping as shown in FIG. 3. That is, when the size of the input data is set to N, the Row×Col 2-D array of FIG. 3 is mapped from left to right and from top to bottom. One row is selected at every clock cycle according to the row selecting rule, and addresses are generated one by one in the selected row according to a given interleaving rule. After each row is selected once, the row selecting rule is used again to select the rows, the given interleaving rule to generate all the addresses. At this point, Row×Col≧N, and the number of rows is set to be larger than the effective free distance $d_{free}$ of the internal encoder of the SCCC encoder.

Referring to FIG. 3, in each row, the addresses are generated according to a corresponding interleaving rule, and the random addresses are generated according to P(r,k) which uses the PNSR or the linear recursive equation in the embodiment. P(r,k) is a generic Address Mapping function (at kth address in r row). Here, a Kth address read from an rth row becomes P(r,k). The row selecting operation is based on a row multiplexing rule or a group multiplexing rule. According to such rules, each row is selected only once at the Row clock. Generating the random addresses for each row and selecting the rows according to the multiplexing rule is to prevent two or more invalid addresses from being consecutively punctured when Row×Col≧N.

As stated above, the 2-D SCCC interleaver according to an embodiment of the present invention maps 1-D data of size N to a 2-D array of size Row×Col, selects one row at each clock cycle according to the row selecting rule, and generates the addresses one by one in the selected row according to the given interleaving rule.

A general description will now be made of operation performed by the 2-D SCCC interleaver according to an embodiment of the present invention.

In first step, the parameters corresponding to the interleaver size N, including the parameters for rows, columns, the interleaving rule P(r,k) and the types of P(r,k), are set up. This process is performed by the parameter setup unit 100 of FIG. 2.

In the second step, a row is selected at every clock and the addresses are generated in the selected row using the P(r,k). This process is can be divided into row multiplexing, address generation and address combination. The row multiplexing operation is performed by the row selector 120 of FIG. 2, the address generation operation is performed by the address generator 110 and the address combination operation is performed by the address combiner 130.

In the third step, it is examined whether the generated address is valid address. If it is invalid address, the address is not output. Otherwise, the address is output as a read address. This process can be called "address puncturing", and is performed by the address puncturer 140 of FIG. 2. After the read address is output, the second and third steps are performed at the next clock. For reference, "address puncturing" can be classified into explicit address puncturing in which puncturing is performed after generating the address, and implicit address puncturing in which an invalid address is previously detected and deleted. With regard to a difference between the two methods, the former method uses one clock, and the latter method deletes the invalid address without using the clock. Conceptually, explicit address puncturing is identical to implicit address puncturing, but they can differ in implementation.

Figure 4:
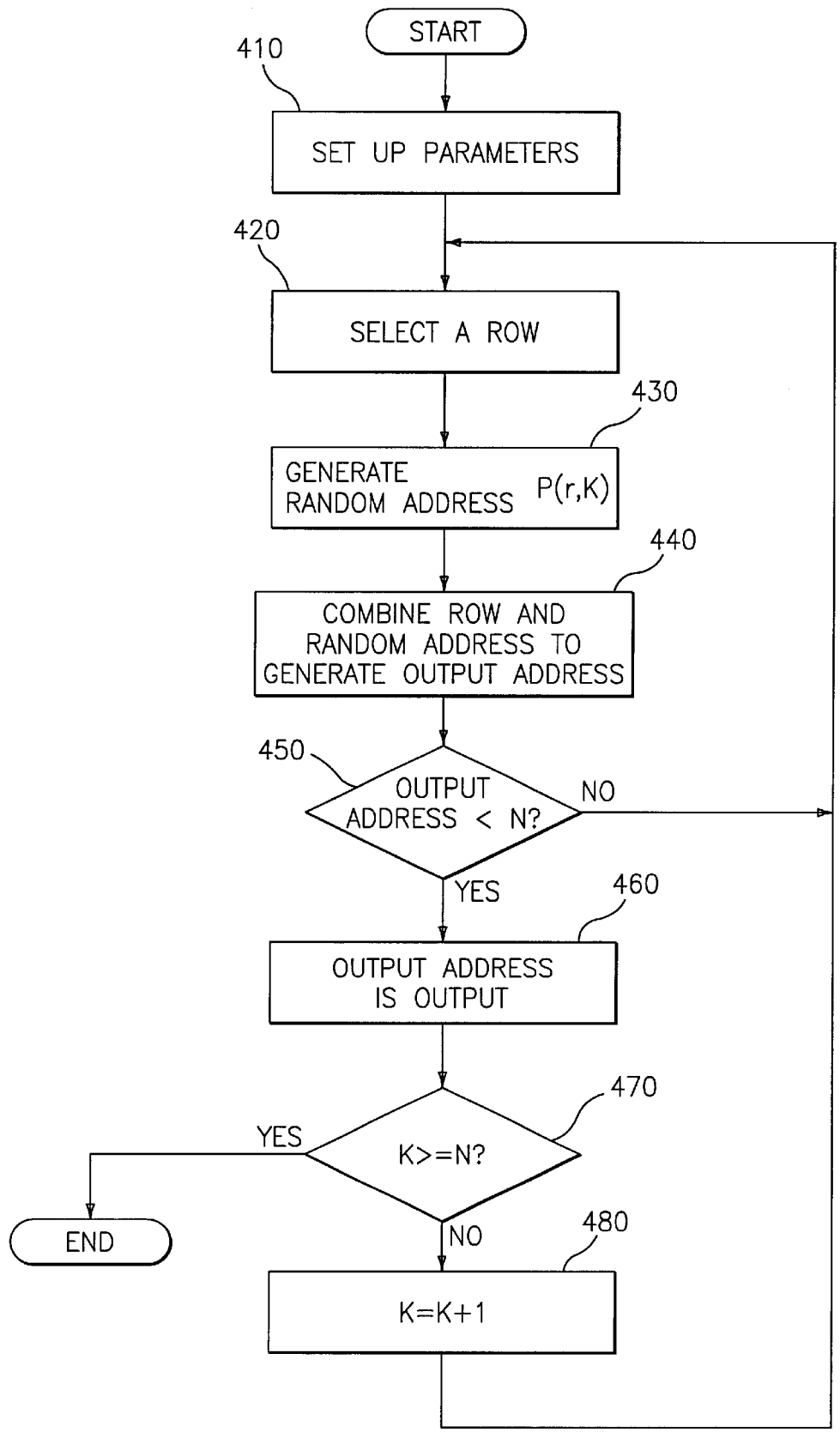
FIG. 4 is a flow chart illustrating operation of the 2-D SCCC interleaver according to an embodiment of the present invention.

The first, second and third steps are all controlled by the controller 150 of FIG. 2 in accordance with the procedure shown in FIG. 4.

FIG. 4 is a flow chart illustrating operation performed by the 2-D SCCC interleaver according to the present invention.

In FIG. 4, step 410 corresponds to the first step; steps 420, 430 and 440 correspond to the second step; and steps 450 and 460 correspond to the third step. In step 470, it is determined whether N addresses are all output. If the N addresses are not output all, k is increased by one to generate another address, in step 480.

Referring to FIG. 4, the parameter setup unit 100 sets up the parameters corresponding to the given interleaver size N, i.e., the number of rows and columns, and the interleaving rule P(r,k), in step 410. The parameters can be differently set up according to the type of the interleaving rule P(r,k). The row selector 120 selects a row every clock, in step 420. The address generator 110 generates random addresses in the selected row according to the set interleaving rule P(r,k) in step 430. The address combiner 130 combines the output of the address generator 110 with the output of the row selector 120 to generate an output address, in step 440. Here, the address combiner 130 can combine the output of the row selector 120 as the high bits with the output of the address generator 110 as the low bits to generate the output address. The address puncturer 140 determines in step 450 whether the generated address is a valid address. If the generated address is a valid address, i.e., if the generated output address is smaller than the interleaver size N, the address puncturer 140 outputs the generated output address, as it is, in step 460. Thereafter, it is determined in step 470 whether N addresses are all output, by comparing the interleaver size N with the value K. If N addresses are not output all, the value K is increased by one to generate another address in step 480. Thereafter, the procedure returns to step 420. Steps 470 and 480 are performed by the controller 140.

Otherwise, if the generated output address is an invalid address, i.e., if the generated output address is not smaller than the interleaver size N, the address puncturer 140 does not output the generated output address. That is, when the generated output address is not a valid address, steps 460 to 480 are skipped and the procedure returns to step 420.

2-D SCCC Interleaver's Property

The interleaver according to the preferred embodiment of the present invention is implemented by the 2-D SCCC interleaver. A description will be now made as to how the 2-D SCCC interleaver performs error correction on the data including error components generated due to noise. That is, a description will be made of the fact that the 2-D SCCC interleaver according to the preferred embodiment of the present invention can perform error correction more efficiently. Herein, for convenience, the description will be made with reference to a 4×8 interleaver having 4 rows and 8 columns. Therefore, it is assumed that puncturing the invalid address is not required. In addition, it is assumed that a correctly transmitted symbol is a zero (0) vector. Therefore, '0' indicates the normally transmitted symbol, and '1' indicates generation of a symbol error.

Figure 6:
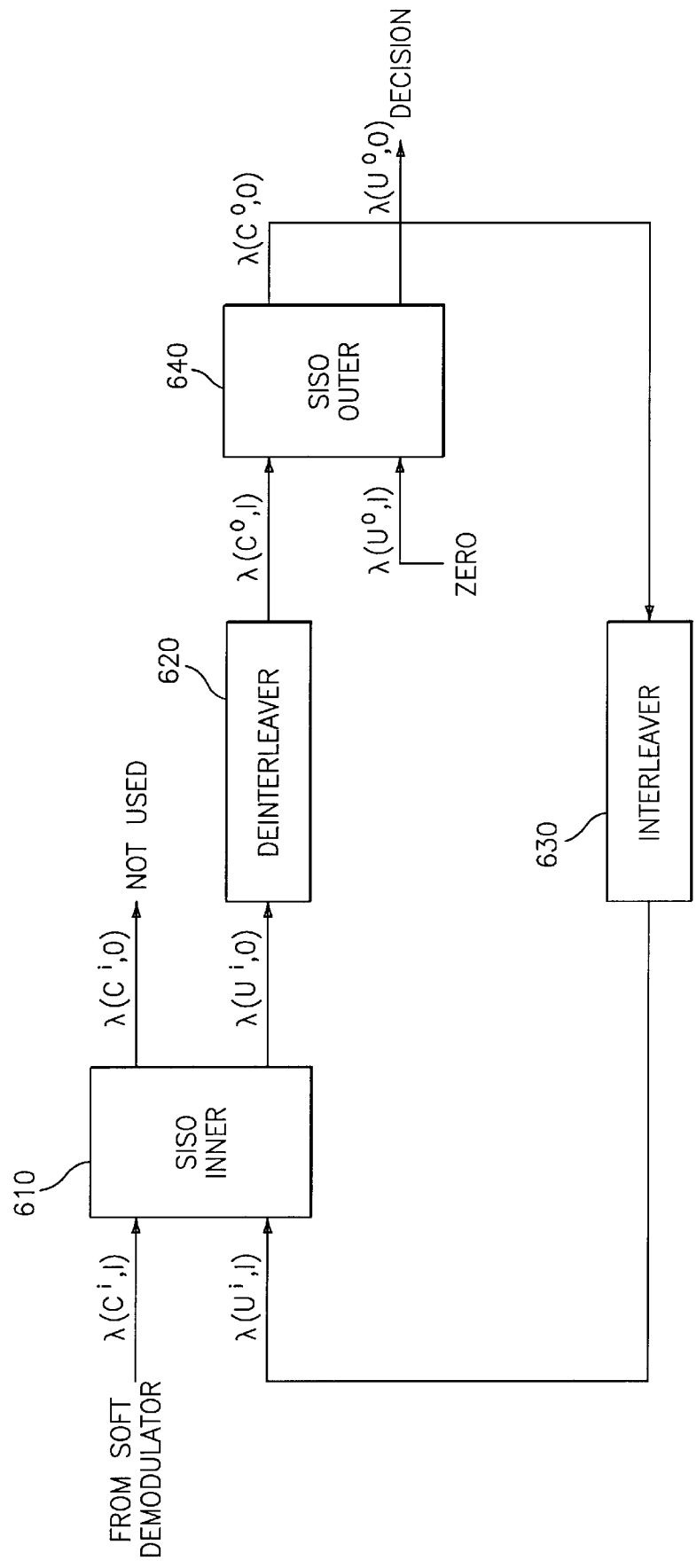
FIG. 6 is a diagram illustrating an SCCC decoder according to an embodiment of the present invention.

FIG. 6 shows the structure of an SCCC decoder according to an embodiment of the present invention. The decoder is comprised of a SISO inner decoder 610, a SISO outer decoder 640, an SCCC interleaver 630 and an SCCC deinterleaver 620. Here, decoding is iteratively performed in the order of inner decoding and outer decoding.

Referring to FIG. 6, $\lambda(C^i,I)$ and $\lambda(C^i,O)$ at the input and output ports of the SISO inner decoder 610 indicate a unconstrained LLR (Log Likelihood Ratio) when the second parameter is I, and indicate a code-constrained LLR when the second parameter is O. In addition, the first parameter U indicates an information symbol of the encoder and the first parameter C indicates a code symbol. Further, a superscribed 'o' indicates the outer encoder and a superscribed 'i' indicates the inner encoder.

The SISO inner decoder 610 decodes a soft input received from a soft demodulator (not shown) and extrinsic information $\lambda(U^i,I)$ obtained in the decoding process of the SISO outer decoder 640 to generate a new LLR for decoding of the following SISO outer decoder 640, and provides the generated new LLR to the deinterleaver 620. Here, $\lambda(U^i,I)$ is initially set to zero (0). $\lambda(C^o,I)$, which is output by the deinterleaver 620, is decoded by the SISO outer decoder 640 to output $\lambda(U^o,O)$ and $\lambda(C^o,O)$ which are improved LLRs. $\lambda(U^o,O)$ is used as an output value DECISION for deciding the information data, and $\lambda(C^o,O)$ is provided to the SCCC interleaver 630 for continuous iterative decoding and rearranged in the original sequence.

Table 1 below shows the decoding results of the SCCC inner decoder 610 of FIG. 6, wherein a place with '1' indicates an error correction-failed place. A preferable interleaving rule should be determined such that the data inputs should be dispersed over the $d_{free}$ by interleaving the consecutively generated errors shown in Table 1 so that the following outer decoder 640 can easily correct the generated errors. These consecutively generated errors are burst errors from transmission after inner decoding.

TABLE 1

| | Write → | | | | | | | | |
|---|---|---|---|---|---|---|---|---|---|
| Read | 0 | 0 | 0 | 0 | 0 | 1 | 1 | 1 | 1 | 1 |
| ↓ | 0 | 0 | 0 | 0 | 0 | 0 | 0 | 0 | 0 | 0 |
| | 1 | 1 | 1 | 0 | 0 | 0 | 0 | 0 | 0 | 0 |
| | 0 | 0 | 0 | 1 | 1 | 0 | 0 | 0 | 0 | 0 |

In Table 1, left to right is the direction for writing the data in an interleaving memory (now shown, but included in the interleaver 630 of FIG. 6), and top to bottom is the direction for reading the data stored in the interleaving memory. Referring to Table 1, it is noted that the data stream has consecutively generated errors of '11111', '111', and '11'. To correct the errors included in the data, the 2-D SCCC interleaver according to an embodiment of the present invention applies the interleaving rule to each row as shown in Table 2 below.

Referring to Table 2, an interleaving rule of {0,5,7,6,8,4, 2,1,3,9} is applied to the first row, an interleaving rule of {1,9,3,6,5,2,7,4,0,8} to the second row, an interleaving rule of {7,6,0,5,2,9,4,1,8,3} to third row, and an interleaving rule of {4,8,1,5,7,0,6,3,9,2} to the fourth row. The numeral in each column or position within a row of Table 2 indicates the sequence of the data to be read from that row. For example, the first read data in the first row is data position '0' in the first column, and second read data in that row is data position '1' in the eighth column. One data position is read from one row at one clock cycle, and one data position is read from the next at the next clock cycle. Since each row is selected once every clock cycle, data is sequentially read in an actually given row every 4 clocks.

TABLE 2

| 0 | 5 | 7 | 6 | 8 | 4 | 2 | 1 | 3 | 9 |
|---|---|---|---|---|---|---|---|---|---|
| 1 | 9 | 3 | 6 | 5 | 2 | 7 | 4 | 0 | 8 |
| 7 | 6 | 0 | 5 | 2 | 9 | 4 | 1 | 8 | 3 |
| 4 | 8 | 1 | 5 | 7 | 0 | 6 | 3 | 9 | 2 |

In addition, the 2-D SCCC interleaver according to an embodiment of the present invention applies a row (or group) multiplexing (or selecting) rule. It is assumed that the row selecting rule is a bit reversal row multiplexing rule= {0,2,1,3}. Here, the "bit reversal row multiplexing rule" refers to reversing a binary bit value of each row and selecting the rows in the order of the resulting bit reversed value. That is, the binary value of the 4 rows has the order of {00,01,10,11}={0,1,2,3} and the resulting order after reversing the binary values is {00,01,10,11}={0,2,1,3}. As a result, the rows are selected in the order of {0,2,1,3}.

By selecting the rows according to the above bit reversal multiplexing rule and applying the unique interleaving rules to the selected rows, the error pattern can be changed as shown in Table 3 below.

TABLE 3

| 0 | 1 | 0 | 0 | 1 | 0 | 0 | 0 | 1 | 0 |
|---|---|---|---|---|---|---|---|---|---|
| 0 | 0 | 1 | 0 | 0 | 0 | 1 | 0 | 0 | 0 |
| 0 | 0 | 0 | 1 | 0 | 1 | 0 | 0 | 0 | 1 |
| 0 | 1 | 0 | 0 | 0 | 0 | 1 | 0 | 0 | 0 |

In Table 3, where the above-stated interleaving rule is applied, the first 4 bits ($1^{st}$ to $4^{th}$ columns), 0, 1, 0, 0, of the first row are obtained by selecting the rows according to the row multiplexing rule (i.e., {0,2,1,3}) and the positions within each row according to the interleaving rule for that row (e.g. {0,5,7,6,8,4,2,1,3,9} for the first row—row 0, as shown in Table 2). It should be remembered that the values "0" and "1" in Table 1 represent data without errors and data with errors, respectively.

Following the example of Table 3, the first row, first column or position entry in Table 3 ("0") would be from the first row (row 0, according to the row multiplexing rule) and the first position (according to the location of "0" in Table 2—the interleaving rule) of Table 1. The first row, second position or column entry in Table 3 is from the third row (row 2, according to the row multiplexing rule) and the third position (according to the location of "0" in the third row of Table 2) of Table 1. The first row, third position or column entry in Table 3 is from the second row (row 1, according to the row multiplexing rule) and the ninth position (according to the location of "0" in the second row of Table 2) of Table 1. The first row, fourth position or column entry of Table 3 is from the fourth row (row 3, according to the row multi- plexing rule) and the sixth position (according to the location of "0" in the fourth row of Table 2) of Table 1. The result is the first four values of Table 3: 0, 1, 0, 0.

After these first four values are obtained, the row multiplexing rule {0,2,1,3} starts over again. However, in this iteration, the position of the data is determined by the location of "1" in Table 2. The next entry (first row, fifth column or position) in Table 3 ("1") is from the first row (row 0, according to the row multiplexing rule) and the eighth position (according to the location of "1" in the first row of Table 2) of Table 1. The first row, sixth position or column entry in Table 3 is from the third row (row 2, according to the row multiplexing rule) and the eighth position (according to the location of "1" in the third row of Table 2) of Table 1. The first row, seventh position or column entry in Table 3 is from the second row (row 1, according to the row multiplexing rule) and the first position (according to the location of "1" in the second row of Table 2) of Table 1. The first row, eighth position or column entry of Table 3 is from the fourth row (row 3, according to the row multiplexing rule) and the third position (according to the location of "1" in the fourth row of Table 2) of Table 1. The result is the 4 bits of $5^{th}$ to $8^{th}$ columns of the first row in Table 3: 1, 0, 0, 0.

After these four values are obtained, the row multiplexing rule {0,2,1,3} again repeats; however, now the position of the data is determined by the location of "2" in Table 2. The ninth entry (first row, ninth column or position) in Table 3 ("1") is from the first row (row 0, according to the row multiplexing rule) and the seventh position (according to the location of "2" in the first row of Table 2) of Table 1. The first row, tenth position or column entry in Table 3 is from the third row (row 2, according to the row multiplexing rule) and the fifth position (according to the location of "2" in the third row of Table 2) of Table 1. The second row, first position or column entry in Table 3 is from the second row (row 1, according to the row multiplexing rule) and the sixth position (according to the location of "2" in the second row of Table 2) of Table 1. The second row, second position or column entry of Table 3 is from the fourth row (row 3, according to the row multiplexing rule) and the tenth position (according to the location of "2" in the fourth row of Table 2) of Table 1. The result is the 4 bits of the $9^{th}$ to $10^{th}$ columns of the first row and the $1^{st}$ to $2^{nd}$ columns of the second row in Table 3: 1, 0, 0, 0.

The next four values are obtained in the same manner, with the position of the data being determined by the location of "3" in Table 2. The $2^{nd}$ row, $3^{rd}$ position entry in Table 3 ("1") is from the first row (row 0) and the ninth position (according to the location of "3" in the first row of Table 2) of Table 1. The $2^{nd}$ row, $4^{th}$ position entry in Table 3 is from the third row (row 2) and the tenth position (according to the location of "3" in the third row of Table 2) of Table 1. The $2^{nd}$ row, $5^{th}$ position entry in Table 3 is from the second row (row 1) and the third position (according to the location of "3" in the second row of Table 2) of Table 1. The $2^{nd}$ row, $6^{th}$ position entry in Table 3 is from the fourth row (row 3) and the eighth position (according to the location of "3" in the fourth row of Table 2) of Table 1. The result is the 4 bits of the $3^{rd}$ to $6^{th}$ columns of the second row in Table 3: 1,0,0,0.

Thus, the pattern repeats. The next values are determined by the location of "4" in the four rows of Table 2. The $2^{nd}$ row, $7^{th}$ position entry in Table 3 ("1") is from the $1^{st}$ row (row 0) and the sixth position of Table 1. The $2^{nd}$ row, $8^{th}$ position entry in Table 3 is from the $3^{rd}$ row (row 2) and the seventh position of Table 1. The $2^{nd}$ row, $9^{th}$ position entry in Table 3 is from the $2^{nd}$ row (row 1) and the eighth position of Table 1. The $2^{nd}$ row, $10^{th}$ position entry in Table 3 is from the $4^{th}$ row (row 3) and the eighth position of Table 1. The resulting 4 bits of $7^{th}$ to $10^{th}$ columns of the second row in Table 3 are 1, 0, 0, 0. The next values are determined by the location of "5" in the four rows of Table 2. The $3^{rd}$ row, $1^{st}$ position entry in Table 3 ("0") is from the $1^{st}$ row (row 0) and the $2^{nd}$ position of Table 1. The $3^{rd}$ row, $2^{nd}$ position entry in Table 3 is from the $3^{rd}$ row (row 2) and the $4^{th}$ position of Table 1. The $3^{rd}$ row, $3^{rd}$ position entry in Table 3 is from the $2^{nd}$ row (row 1) and the $5^{th}$ position of Table 1. The $3^{rd}$ row, $4^{th}$ position entry in Table 3 is from the $4^{th}$ row (row 3) and the $4^{th}$ position of Table 1. The resulting 4 bits of the $1^{st}$ to $4^{th}$ columns of the $3^{rd}$ row in Table 3 are: 0, 0, 0, 1.

The next values are determined by the location of "6" in the four rows of Table 2. The $3^{rd}$ row, $5^{th}$ position entry in Table 3 ("0") is from the $1^{st}$ row (row 0) and the $4^{th}$ position of Table 1. The $3^{rd}$ row, $6^{th}$ position entry in Table 3 is from the $3^{rd}$ row (row 2) and the $2^{nd}$ position of Table 1. The $3^{rd}$ row, $7^{th}$ position entry in Table 3 is from the $2^{nd}$ row (row 1) and the $4^{th}$ position of Table 1. The $3^{rd}$ row, $8^{th}$ position entry in Table 3 is from the $4^{th}$ row (row 3) and the $7^{th}$ position of Table 1. The resulting 4 bits of the $5^{th}$ to $8^{th}$ columns of the third row in Table 3 is 0, 1, 0, 0. The next values are determined by the location of "7" in the four rows of Table 2. The $3^{rd}$ row, $9^{th}$ position entry in Table 3 ("0") is from the $1^{st}$ row (row 0) and the $3^{rd}$ position of Table 1. The $3^{rd}$ row, $10^{th}$ position entry in Table 3 is from the $3^{rd}$ row (row 2) and the $1^{st}$ position of Table 1. The $4^{th}$ row, $1^{st}$ position entry in Table 3 is from the $2^{nd}$ row (row 1) and the $7^{th}$ position of Table 1. The $4^{th}$ row, $2^{nd}$ position entry in Table 3 is from the $4^{th}$ row (row 3) and the $5^{th}$ position of Table 1. The resulting 4 bits of $9^{th}$ and $10^{th}$ columns of the third row and $1^{st}$ and $2^{nd}$ columns of the fourth row in Table 3 are: 0, 1, 0, 1.

The next values are determined by the location of "8" in the four rows of Table 2. The $4^{th}$ row, $3^{rd}$ position entry in Table 3 ("0") is from the $1^{st}$ row (row 0) and the $5^{th}$ position of Table 1. The $4^{th}$ row, $4^{th}$ position entry in Table 3 is from the $3^{rd}$ row (row 2) and the $9^{th}$ position of Table 1. The $4^{th}$ row, $5^{th}$ position entry in Table 3 is from the $2^{nd}$ row (row 1) and the $10^{th}$ position of Table 1. The $4^{th}$ row, $6^{th}$ position entry in Table 3 is from the $4^{th}$ row (row 3) and the $2^{nd}$ position of Table 1. The resulting 4 bits of the $3^{rd}$ to $6^{th}$ columns of the fourth row in Table 3 are: 0, 0, 0, 0. The next values are determined by the location of "9" in the four rows of Table 2. The $4^{th}$ row, $7^{th}$ position entry in Table 3 ("1") is from the $1^{st}$ row (row 0) and the $10^{th}$ position of Table 1. The $4^{th}$ row, $8^{th}$ position entry in Table 3 is from the $3^{rd}$ row (row 2) and the $6^{th}$ position of Table 1. The $4^{th}$ row, $9^{th}$ position entry in Table 3 is from the $2^{nd}$ row (row 1) and the $2^{nd}$ position of Table 1. The $4^{th}$ row, $10^{th}$ position entry in Table 3 is from the $4^{th}$ row (row 3) and the $9^{th}$ position of Table 1. The resulting 4 bits of the $7^{th}$ to $10^{th}$ columns of the fourth row in Table 3 is '1000'.

When the error pattern shown in Table 3 is compared with the error pattern before interleaving, shown in Table 1, the consecutively generated errors are well dispersed by the 2-D SCCC interleaver according to an embodiment of the present invention. This is in order to have the distance between the adjacent bits after interleaving be more than 4 by maintaining the number of the rows at 4. The dispersed errors will cause an increase in the probability that the error will be corrected at the outer decoder.

In conclusion, the interleaver according to an embodiment of the present invention uses the 2-D SCCC interleaver to obtain the distance property, and generates the random addresses in each row to maintain the random property in each row.

Row Multiplexing

As mentioned above, the 2-D SCCC interleaver according to an embodiment of the present invention selects the rows according to the row multiplexing rule or group multiplexing rule to maintain the distance between the adjacent bits after interleaving. That is, the 2-D SCCC interleaver performs row multiplexing using the rule for maintaining a constant distance rather than sequentially selecting the rows. This row multiplexing rule can be applied to the case where the number of the rows can be expressed in terms of powers of 2 as well as the case where the number of rows cannot be expressed in terms of powers of 2.

1. A Case Where The Number of Rows is Power of 2

When the number of the rows is $2^8$ (which is the power of 2), the binary values of all the rows are bit reversed and then the rows are selected in the order of the bit reversed values, as shown in Table 4 below. That is, when the binary values {000,001,010,011,100,101,110,111} of the $0^{th}$ to $7^{th}$ rows are bit reversed, the result is {000,100,010,110,001, 101,011,111}={0,4,2,6,1,5,3,7}. Therefore, the rows are selected in the order of {0,4,2,6,1,5,3,7} as shown in Table 4.

TABLE 4

| Row Index | Binary | Bit Reversed Binary | Selected Row Index |
|---|---|---|---|
| 0 | 000 | 000 | 0 |
| 1 | 001 | 100 | 4 |
| 2 | 010 | 010 | 2 |
| 3 | 011 | 110 | 6 |
| 4 | 100 | 001 | 1 |
| 5 | 101 | 101 | 5 |
| 6 | 110 | 011 | 3 |
| 7 | 111 | 111 | 7 |

2. A Case Where The Number of Rows is not Power of 2

Two methods may be used in this case. The first method, when the number of the rows is not expressed in terms of powers of 2, is to use a table look up method. For example, when the number of the rows is 7, a look-up table can be implemented such that the rows should be selected in the order of {0,4,1,5,2,6,3}.

The second method, when the number of the rows is not expressed in terms of powers of 2, is to use bit reversal multiplexing. In this method, the bit reversal multiplexing is performed using the minimum value out of the numbers which are both a power of 2 and are larger than or equal to the number of the When that list is generated, the non-existent rows are deleted. For example, when the number of the rows is 7, the minimum value out of the numbers, which are both a power of 2 and are larger than or equal to the number of the rows, is 8. Then bit reversal is performed, as if the number of the rows is 8, generating the row selecting order of {0,4,2,6,1,5,3,7}. Now the non-existent row of 7 is deleted from this, leaving a row selecting order of {0,4,2, 6,1,5,3}, and this order is used.

Selecting The Number of Rows

The number of the rows selected in designing the 2-D SCCC interleaver can greatly affect the whole performance of the interleaver. In general, for the interleaver size N, as the number of the rows approximates to sqrt(N), the distance property tends to increase but the random property in each row tends to decrease. For example, when the number of the rows is set to an excessively large value, using the PN shift register for random address generation will cause a decrease in the order of the primitive polynomial. As an alternative example, if the number of the rows is set to 1 so that the random property is obtained at the expense of the distance property, it becomes equivalent to the performance of the 1-D random address generation. That is, since selecting the rows causes a trade-off between the distance property and the random property, the rows should be selected such that the properties should be properly balanced, in order to increase the whole performance of the SCCC encoder.

In addition, when the inner decoder cannot correct the errors at the receiver, performance of the SCCC depends on how efficiently the outer (or inner) decoder can correct the remaining errors. As described above, if there exists an error pattern in which the errors are consecutively generated, dispersing the error pattern over a proper distance will increase the probability of error correction at the outer decoder. Therefore, if the distance between two adjacent error bits becomes over the free distance $d_{free}$ of the component decoder after interleaving/deinterleaving, the succeeding error bits can be mostly corrected.

Therefore, as shown in FIG. 1, in a 4-state SCCC encoder, since $d_{free}$ of the terminating component encoder is about 5, if 8 ($=2^3$) or 16 ($=2^4$), which are powers of 2, is selected as the number of the rows, it is possible to maintain an optimal balance between the distance property and the random property. However, if the number of the rows is increased to 32, the distance property will increase whereas the random property will decrease.

Figure 10:
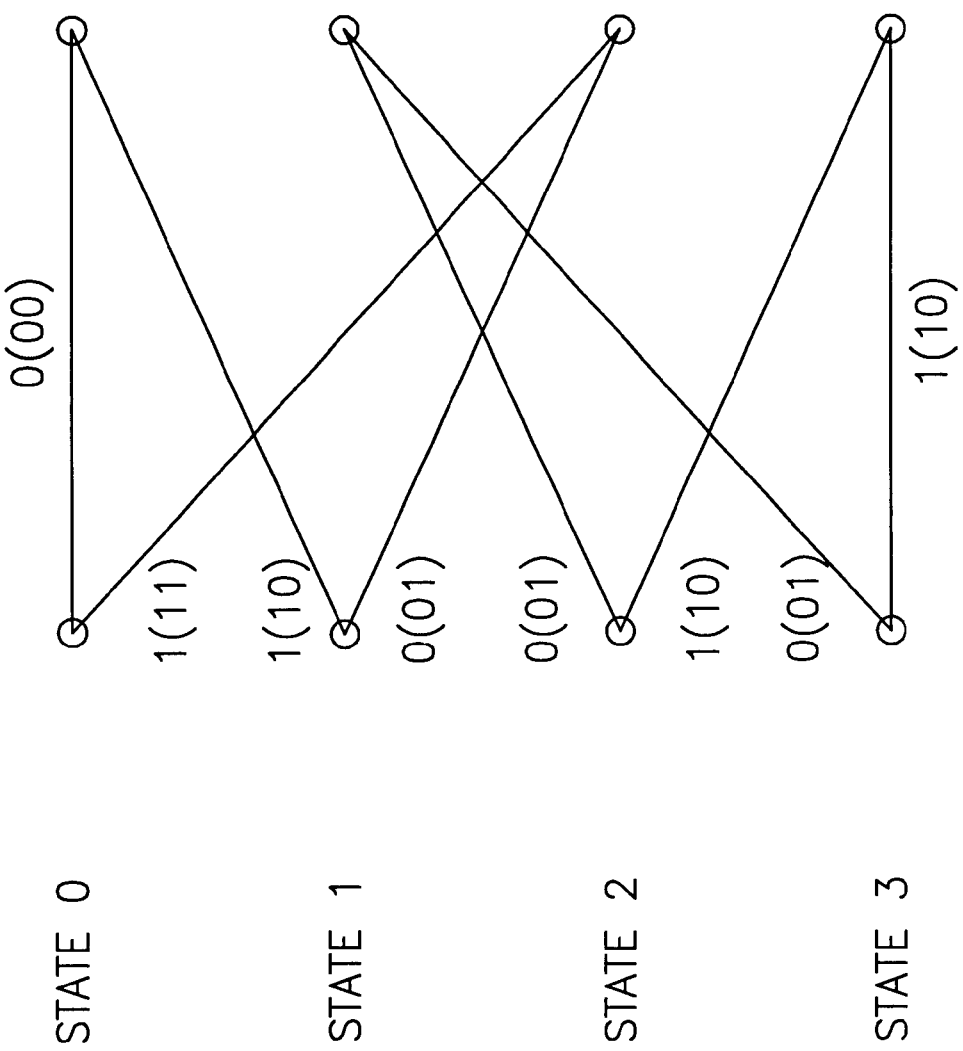
FIG. 10 is a diagram illustrating a trellis structure of the component encoder shown in FIG. 1.

FIG. 10 shows a trellis structure of the component encoders 10 and 40 of FIG. 1. In the trellis structure, the numeral outside of each parenthesis indicates an information bit and the numeral inside of the parenthesis indicates a codeword. Since the component encoder is a systematic encoder, the information bit is always identical to the $1^{st}$ code bit. To determine the optimal number of the rows, reference will be made to the characteristics of the encoder with reference to FIGS. 1 and 10.

In FIG. 1, since the outer encoder 10 commonly uses the RSC, an input for having the minimum outer code weight is an input sequence . . . 000|110|0000 . . . which starts from the zero state STATE_0 and returns to the zero state. An outer code of this input is a code . . . 000|11011|0000 . . . with weight 5 and this becomes an input sequence to the inner encoder 10 in the following stage. That is, the actual $d_{free}$ of the inner encoder 10 is not 5 where the input with the weight 2 is input, but is a value determined when the input pattern is such that . . . 000|1101101|000 . . . , where . . . 000|11011|000 . . . returns to the zero state, is input to the inner encoder 10. Here, the last '01' is an error generated to ensure that . . . 000|11011|000 . . . returns to the zero state. This error is generated by noise in transition channel. A code corresponding to such an input is . . . 000|11|10|01|10|11|01|10|000 . . . , and the weight of this code is 9. Therefore, the effective $d_{free}$ (or effective minimum distance) between the codes in the inner encoder becomes 9. This means that the number of the rows in the interleaver should be larger than 9. That is, it is noted that when Row>9 and the bit reversal row multiplexing rule is used, the optimal number of the rows is 16, which is larger than 9 and is a power of 2.

Table 5 below shows the parameters which can be determined when the SCCC interleaver size has a value between 512 and 8192 and the PN shift register is used to generate the random addresses.

TABLE 5

| N | Row | | | Column | | |
|---|---|---|---|---|---|---|
| 513–1024 | 8 | 16 | 32 | 128 | 64 | 32 |
| 1025–2048 | 8 | 16 | 32 | 256 | 128 | 64 |
| 2049–4096 | 8 | 16 | 32 | 512 | 256 | 128 |
| 4097–8192 | 8 | 16 | 32 | 1024 | 512 | 256 |

Random Address Generation and 0-Address Augmentation

A method using a PN shift register (PNSR) or a method using a linear recursive equation can be typically used for a method of generating the random address in each row, i.e., determining the random interleaving rule P(r,k).

When the PNSR is used, for a given column value, a primitive polynomial corresponding to the column value is selected and an initial seed value is set for the PNSR. An address generated at this time uses a state of the PNSR. Otherwise, when the linear recursive equation is used, for the given column value, an initial value is set and then an address is generated by an iterative formula. A detailed description of the two embodiments will be given later. In the two embodiments, since P(r,k) does not commonly generate an '0' address, an '0' address is augmented to a given random sequence to use a 0-augmented random sequence. That is, a $0^{th}$ address is necessarily selected at a predetermined time, e.g., at the first clock cycle of each row. By doing so, it is possible to access every address in each row.

Figure 7:
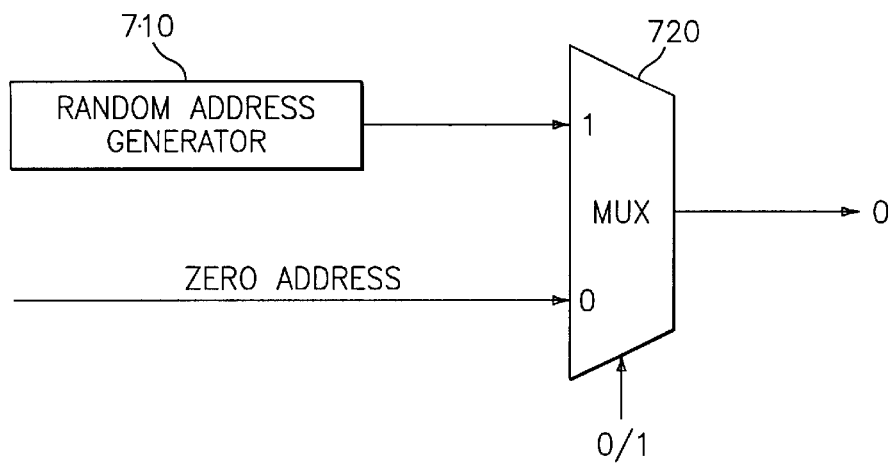
FIG. 7 is a diagram illustrating a 0-augmented random address generator according to an embodiment of the present invention.

FIG. 7 shows a 0-augmented random address generator according to an embodiment of the present invention.

Referring to FIG. 7, a zero (0) address selector (or multiplexer) 720 selects a '0' address and an output of a random address generator 710 according to a value (0/1) of a select signal. Therefore, the random address output from the multiplexer 720 includes the '0'address. In FIG. 7, the '0' address should be selected only once for each row.

1. Random Address Generation Using PNSR

One or two PNSRs can be used, or the PNSR can be used as many as the number of the rows. That is, the random addresses can be generated for each row using one or two PNSRs. Alternatively, the random addresses can be generated for each row using the PNSRs provided as many as the number of the rows.

Embodiment 1: one PNSR is used for interleaving all the rows

In Embodiment 1, all the addresses are generated using one PNSR. An address is obtained with a state of the PNSR. In this case, after one period of the PNSR is completed, although an address generating pattern becomes identical, the absolute address is changed since the row to be selected has changed.

For example, when the interleaver size is N=1024, the rows, the columns, the PNSR's size $M_{PNSR}$ and the row multiplexing rule can be determined as follows.

Rows=16 [0,1,2, . . . , 15]

Columns=64

$M_{PNSR}$=6 (order of the primitive polynomial)

Row multiplexing rule={0,8,4,12,2,10,6,14,1,9,5,13,3,11, 7,15}

Embodiment 2: two different PNSRs are used

In Embodiment 2, a first PNSR, PNSRe, is used for the even rows (0,2,4,6,8,10,12,14, . . . ) and is a second PNSR, PNSRo, is used for the odd rows (1,3,5,7,9,11,13,15, . . . ).

This is to improve the random property by using two PN sequences having different properties.

For example, when the interleaver size is N=1024, the rows, the columns, the PNSR's sizes $M_{PNSRe}$ and $M_{PNSRo}$, and the row multiplexing rule can be determined as follows.

Rows=16 [0,1,2, ... , 15]

Columns=64

$M_{PNSRe}$=6 (order of the primitive polynomial of the even rows)

$M_{PNSRo}$=6 (order of the primitive polynomial of the odd rows)

Row multiplexing rule={0,8,4,12,2,10,6,14,1,9,5,13,3,11,7,15}

Embodiment 3: different PNSRs are used for each row

Embodiment 3 corresponds to normalized Embodiment 2, and, in this embodiment, a different PNSR is used for each row in order to improve the random property. Since every row has an independent PNSR, Embodiment 3 uses ((row number) −1) more PNSRs as compared with Embodiment 1. Therefore, Embodiment 3 has the increased complexity as compared with Embodiment 1.

2. Random Address Generation Using Linear Recursive Equation

Embodiment 4

In this embodiment, only one linear recursive equation is used as in Embodiment 1. A linear recursive equation such as c(j)=[c(j−1)*p]%Row can be used. At this point, Row and p are prime numbers. Here, c(j) indicates an address generated at every clock in each row, and a value of c(0) is set up in the parameter initialization process.

Embodiment 5

In this embodiment, two different linear recursive equations are used as in Embodiment 2. That is, one of the following two equations can be selectively used according to the even rows and the odd rows. For example, $c_e$(j)=[c(j−1)*p]%Row can be used for the even rows, and $c_o$(j)=[c(j−1)*q]%Row can be used for the odd rows. At this point, Row, p and q are the prime numbers. As in Embodiment 4, the values of $c_e$(0) and $c_o$(0) are set up in the parameter initialization process.

Embodiment 6

In this embodiment, a different linear recursive equation is used for each row in a similar manner as Embodiment 3.

Figure 8:
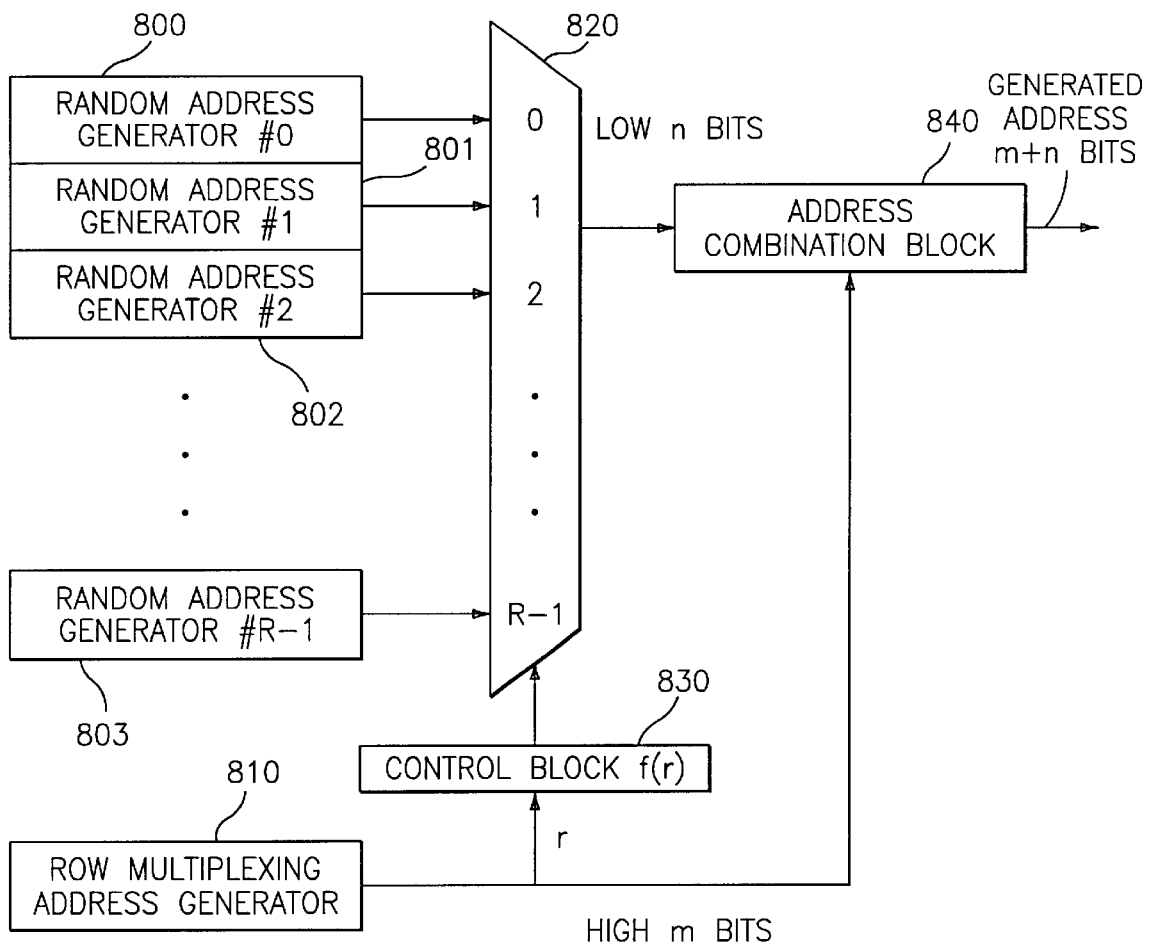
FIG. 8 is a diagram illustrating an SCCC interleaver according to an embodiment of the present invention.

FIG. 8 shows a normalized scheme of the above-discussed embodiments according to the present invention.

Referring to FIG. 8, the scheme is comprised of R random address generators 800–803, a row multiplexing address generator 810, a control block 830, a selector 820 for selecting one of the random address generators according to an output signal of the control block 830, and an address combination block 840 for combining an address output from the selected random address generator with the row multiplexing address to generate an actual address of the data.

In operation, the row multiplexing address generator 810 generates one row address 'r' at each clock cycle, and the control block 830 controls the selector 820 to select one of the R random address generators 801–803 using a row select control function f(r) for the row address r. The address combination block 840 combines the random address selected by the selector 820 with the row address value 'r' to output an address of the data. At this point, the address combination block 840 combines an m-bit row address as the high bits with an n-bit random address as the low bits, to generate an (m+n)-bit output address.

In Embodiments 1 and 4, f(r)=constant, meaning that only one random address generator is used. An interleaver applicable to these embodiments is shown in FIG. 9A.

Figure 9A:
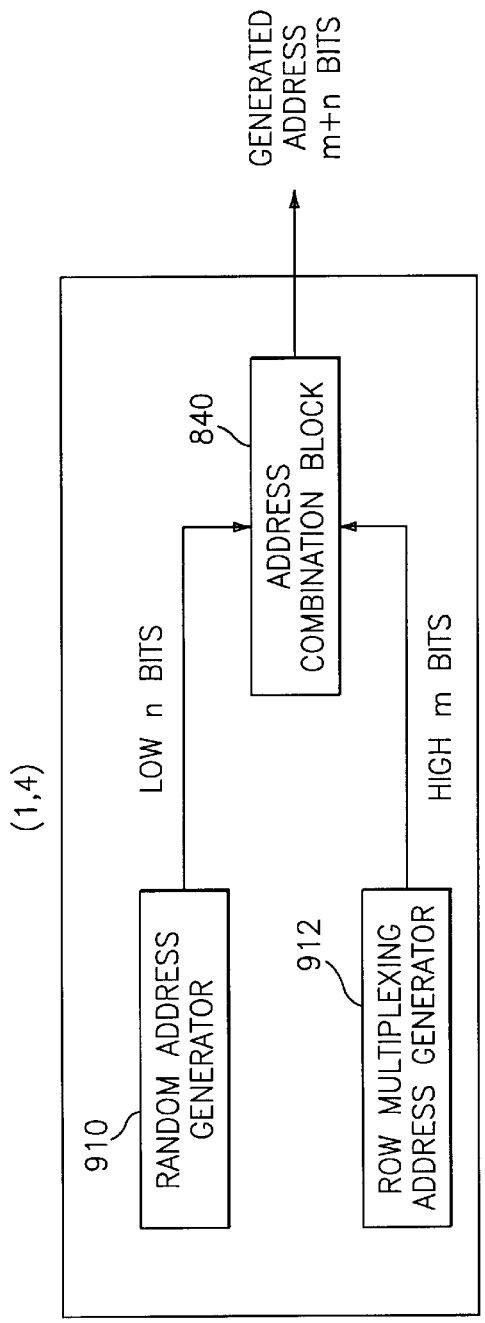
FIGS. 9A, 9B and 9C are diagrams illustrating an SCCC interleaver according to various embodiments of the present invention.

Referring to FIG. 9A, a row multiplexing address generator 912 generates an m-bit row address 'r' at every clock. A random address generator 910 generates an n-bit random address according to a rule which is equally set for every row. The address combination block 840 combines the m-bit row address generated by the row multiplexing address generator 912 as the high bits with the n-bit random address generated by the random address generator 910 as the low bits, so as to generate an (m+n)-bit output address.

Figure 9B:
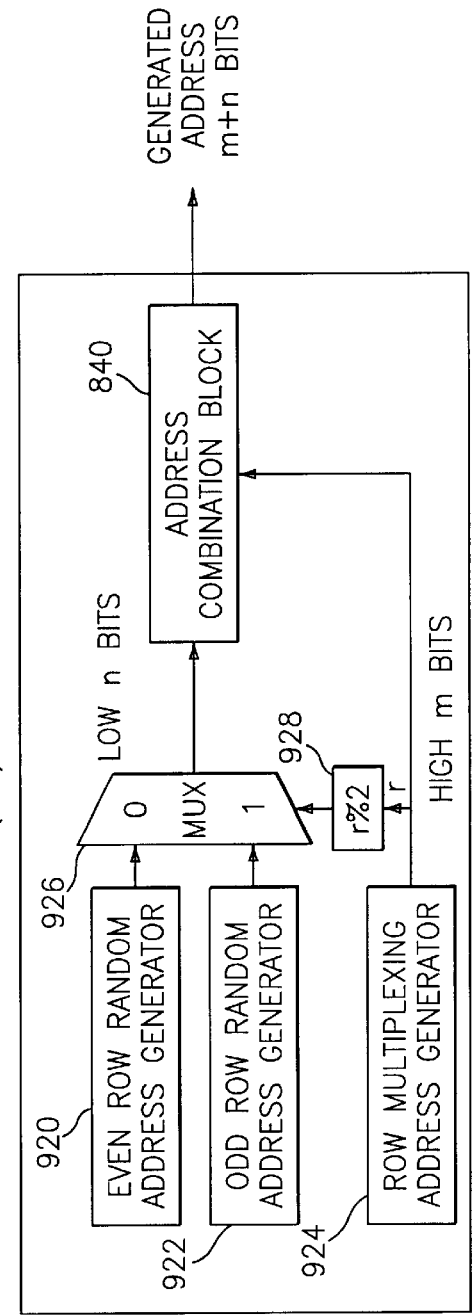

In Embodiments 2 and 5, f(r)=r%2 and an interleaver applicable to these embodiments is shown in FIG. 9B. Here, 'f(r)=r%2' indicates an modulo 2 operation, i.e., for calculating the remainder obtained after dividing r by 2.

Referring to FIG. 9B, a row multiplexing address generator 924 generates an m-bit row address 'r' at each clock cycle. An even-row random address generator 920 generates an n-bit random address according to a rule which is equally set for every even row. An odd-row random address generator 922 generates an n-bit random address according to a rule which is equally set for every odd row. A control block 928 performs f(r)=r%2 operation in response to generation of the row address value 'r' by the row multiplexing address generator 924, and controls a multiplexer (or selector) 926 according to the operation results. The multiplexer 926, under the control of the control block 928, selectively outputs the random addresses generated by the even-row random address generator 920 and the odd-row random address generator 922. That is, the multiplexer 926 outputs the random address generated by the even-row random address generator 926 for the even rows, and outputs the random address generated by the odd-row random address generator 922 for the odd rows. The address combination block 840 combines the m-bit row address generated by the row multiplexing address generator 924 as the high bits with the n-bit random address selected by the multiplexer 926 as the low bits, to generate an (m+n) output address.

Figure 9C:
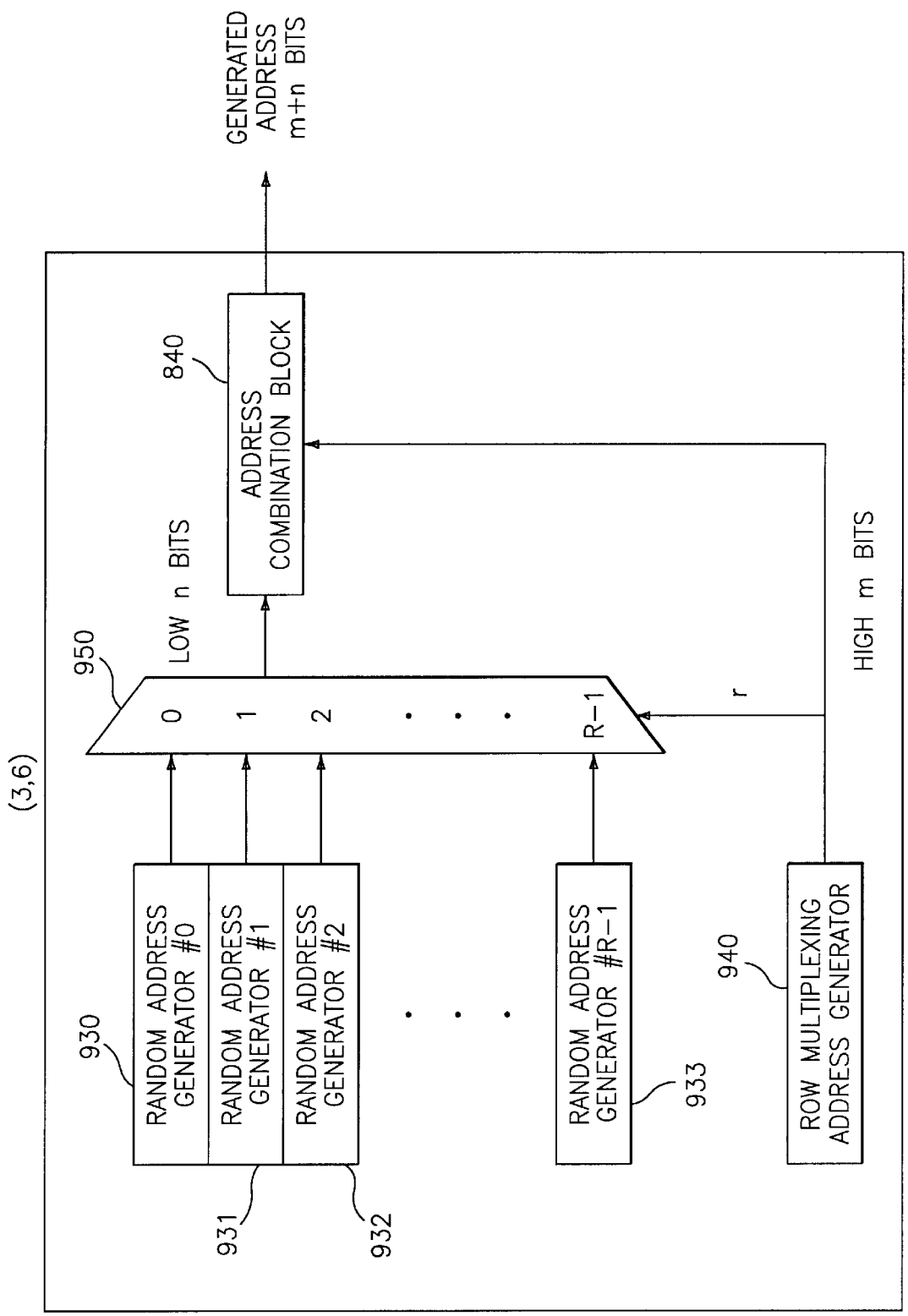

In Embodiments 3 and 6, f(r)=r and an interleaver applicable to these embodiments is shown in FIG. 9C.

Referring to FIG. 9C, a row multiplexing address generator 940 generates an m-bit row address 'r' at each clock cycle. A plurality of random address generators 930–933 each generate an n-bit random address according to a rule which is uniquely set for each row. For example, the random address generator 930 generates an n-bit random address according to a rule set for a $0^{th}$ row, the random address generator 931 generates an n-bit random address according to a rule set for a $1^{st}$ row, the random address generator 932 generates an n-bit random address according to a rule set for a $2^{nd}$ row, and the random address generator 933 generates an n-bit random address according to a rule set for an $(R-1)^{th}$ row. A multiplexer 950 selects, when R rows are sequentially selected, a random address generator corresponding to the selected row, so that an n-bit random address generated by the corresponding random address generator should be provided to the address combination block 840. The address combination block 840 combines the m-bit row address generated by the row multiplexing address generator 940 as the high bits with the n-bit random address selected by the multiplexer 950 as the low bits, to generate an (m+n) output address.

Therefore, it is possible to implement various types of the interleaver by properly determining the row selecting control function f(r).

In the above described embodiments, although the address generation methods are different for each row, the basic concepts are equal. That is, the distance property is increased by row multiplexing of the 2-D SCCC interleaver, and the addresses are randomly generated in each row to maintain the random property. Tables 7A to 9B below show the addresses generated according to the above embodiments, by way of example. In describing address generation, it will be assumed that row multiplexing is performed in the order of {0,2,1,3}.

Embodiment 1 and Embodiment 4

It will be assumed that Row×Col=4×8 and P(r,k) address= {3,7,6,1,4,2,5}. First, the data in the first column is read as shown in Tables 7A and 7B. Table 7A shows when bit reversal for each row is effected. The original row is processed by 0→2→1→3 as shown in the first column of Table 7A. As stated above, '0' address is accessed first in each row. Next, the addresses are accessed as shown in Table 7B. In Table 7B, the outside numeral of each parenthesis indicates a relative address in each row, and the inside numeral of the parenthesis indicates the access order. Therefore, Tables 7A and 7B below can be regarded as a time index.

TABLE 7A

| | |
|---|---|
| 0 | 0(0) |
| 2 | 0(1) |
| 1 | 0(2) |
| 3 | 0(3) |

TABLE 7B

| | | | | | | | |
|---|---|---|---|---|---|---|---|
| 0(0) | 1(28) | 2(16) | 3(4) | 4(8) | 5(24) | 6(20) | 7(12) |
| 0(1) | 1(21) | 2(9) | 3(25) | 4(29) | 5(17) | 6(13) | 7(5) |
| 0(2) | 1(14) | 2(30) | 3(18) | 4(22) | 5(10) | 6(6) | 7(26) |
| 0(3) | 1(7) | 2(23) | 3(11) | 4(15) | 5(31) | 6(27) | 7(19) |

As described above, in Embodiment 1 and Embodiment 4, the same random address generating rule is applied to every row. Referring to Table 7B, the address generating rule {3,7,6,1,4,2,5} is sequentially applied to every row. For the address access order of 0→1→2→3, the first address '0' is selected in each row. That is, '0' in the first row is selected for the first address, '0' in the second row is selected for the second address, '0' in the third row is selected for the third address, and '0' in the fourth row is selected for the fourth address.

For the address access order of 4 to 31, the above address generating rule {3,7,6,1,4,2,5} is applied. Therefore, '3' in the first row is selected for the fourth address, '7' in the second row is selected for the fifth address, '6' in the third row is selected for the sixth address, and '1' in the fourth row is selected for the seventh address. Further, '4' in the first row is selected for the eighth address, '2' in the second row is selected for the ninth address, and '5' in the third row is selected for the tenth address. Similarly, the remaining $11^{th}$ to $31^{st}$ addresses are determined by sequentially selecting the rows and sequentially applying the address generating rule {3,7,6,1,4,2,5} to the selected rows.

Embodiment 2 and Embodiment 5

It will be assumed that Row×Col=4×8, $P_e$(r,k) address= {3,7,6,1,4,2,5} and $P_o$(r,k) address={6,7,3,1,5,2,4}. First, the data in the first row is read as shown in Table 8A. That is, '0' address is accessed in each row. In Tables 8A and 8B, the first and second rows indicate the even rows, and the third and fourth rows indicate the odd rows. In the upper two rows, the addresses are accessed according to Pe (r,K), and in the lower two rows, the addresses are accessed according to Po(r,K). Next, the addresses are accessed as shown in Table 8B. In Tables 8A and 8B, the outside numeral of each parenthesis indicates a relative address in each row, and the inside numeral of the parenthesis indicates the address access order. Therefore, Tables 8A and 8B below can be regarded as a time index.

TABLE 8A

| |
|---|
| 0(0) |
| 0(1) |
| 0(2) |
| 0(3) |

TABLE 8B

| | | | | | | | |
|---|---|---|---|---|---|---|---|
| 0(0) | 1(24) | 2(28) | 3(4) | 4(12) | 5(16) | 6(8) | 7(20) |
| 0(1) | 1(9) | 2(13) | 3(17) | 4(25) | 5(29) | 6(21) | 7(5) |
| 0(2) | 1(26) | 2(30) | 3(10) | 4(18) | 5(14) | 6(6) | 7(22) |
| 0(3) | 1(11) | 2(15) | 3(23) | 4(31) | 5(27) | 6(19) | 7(7) |

As described above, in Embodiment 2 and Embodiment 5, the even-row random address generating rule is applied to the even rows and the odd-row random address generating rule is applied to the odd rows. Referring to Table 8B, since the rows are selected according to the bit reversal row selecting rule, the even-row random address generating rule {3,7,6,1,4,2,5} is applied to the first row ('0' row) and the second row ('1' row), and the odd-row random address generating rule {6,7,3,1,5,2,4} is applied to the third row ('2' row) and the fourth row ('3' row). For the address access order of 0→1→2→3, the first address '0' is selected in each row. That is, '0' in the first row is selected for the first address, '0' in the second row is selected for the second address, '0' in the third row is selected for the third address, and '0' in the fourth row is selected for the fourth address.

For the address access order of 4 to 31, the address generating rule {3,7,6,1,4,2,5} is applied to the even rows and the address generating rule {6,7,3,1,5,2,4} is applied to the odd rows. Therefore, '3' in the first row is selected for the fourth address, '7' in the second row is selected for the fifth address, '6' in the third row is selected for the sixth address, and '7' in the fourth row is selected for the seventh address. Further, '6' in the first row is selected for the eighth address, '1' in the second row is selected for the ninth address, '3' in the third row is selected for the tenth address, and '1' in the fourth row is selected for the $11_{th}$ address. Similarly, the remaining $12^{th}$ to $31^{st}$ addresses are determined by sequentially selecting the rows and applying the address generating rule {3,7,6,1,4,2,5} or {6,7,3,1,5,2,4} to the selected rows.

Embodiment 3 and Embodiment 6

It will be assumed that Row×Col=4×8, P(0,k) address= {3,7,6,1,4,2,5}, P(1,k) address={6,7,3,1,5,2,4}, P(2,k) address={1,7,3,6,4,5,2}, andP(3,k) address={7,3,6,1,2,5,4}. First, the data in the first row is read as shown in Table 9A. That is, '0' address is accessed in each row. Next, the addresses are accessed as shown in Table 9B. P(r,K) exists separately in each row. In Tables 9A and 9B, the outside numeral of each parenthesis indicates a relative address in each row, and the inside numeral of the parenthesis indicates the address access order. Therefore, Tables 9A and 9B below can be regarded as a time index.

TABLE 9A

| |
|---|
| 0(0) |
| 0(1) |
| 0(2) |
| 0(3) |

TABLE 9B

| 0(0) | 1(16) | 2(24) | 3(4)  | 4(20) | 5(28) | 6(12) | 7(8)  |
|------|-------|-------|-------|-------|-------|-------|-------|
| 0(1) | 1(17) | 2(25) | 3(13) | 4(29) | 5(21) | 6(5)  | 7(9)  |
| 0(2) | 1(6)  | 2(30) | 3(14) | 4(22) | 5(26) | 6(18) | 7(10) |
| 0(3) | 1(19) | 2(23) | 3(11) | 4(31) | 5(27) | 6(15) | 7(7)  |

As described above, in Embodiment 3 and Embodiment 6, a unique random address generating rule is applied to each row. Referring to Table 9B, for the address access order of 0→1→2→3, the first address '0' is selected in each row. That is, '0' in the first row is selected for the first address, '0' in the second row is selected for the second address, '0' in the third row is selected for the third address, and '0' in the fourth row is selected for the fourth address.

For the address access order of 4 to 31, the unique address generating rules are applied to the respective rows. The random address generating rule {3,7,6,1,4,2,5} is applied to the first row, the random address generating rule {6,7,3,1,5,2,4} is applied to the second row, the random address generating rule {1,7,3,6,4,5,2} is applied to the third row, and the random address generating rule {7,3,6,1,2,5,4} is applied to the fourth row. Therefore, '3' in the first row is selected for the fourth address, '6' in the second row is selected for the fifth address, '1' in the third row is selected for the sixth address, and '7' in the fourth row is selected for the seventh address. Further, '7' in the first row is selected for the eighth address, '7' in the second row is selected for the ninth address, '7' in the third row is selected for the tenth address, and '3' in the fourth row is selected for the $11^{th}$ address. Similarly, the remaining $12^{th}$ to $31^{st}$ addresses are determined by sequentially selecting the rows and applying the unique address generating rules to the selected rows.

Performance Comparison on 2-D SCCC Interleaver

Figure 5A:
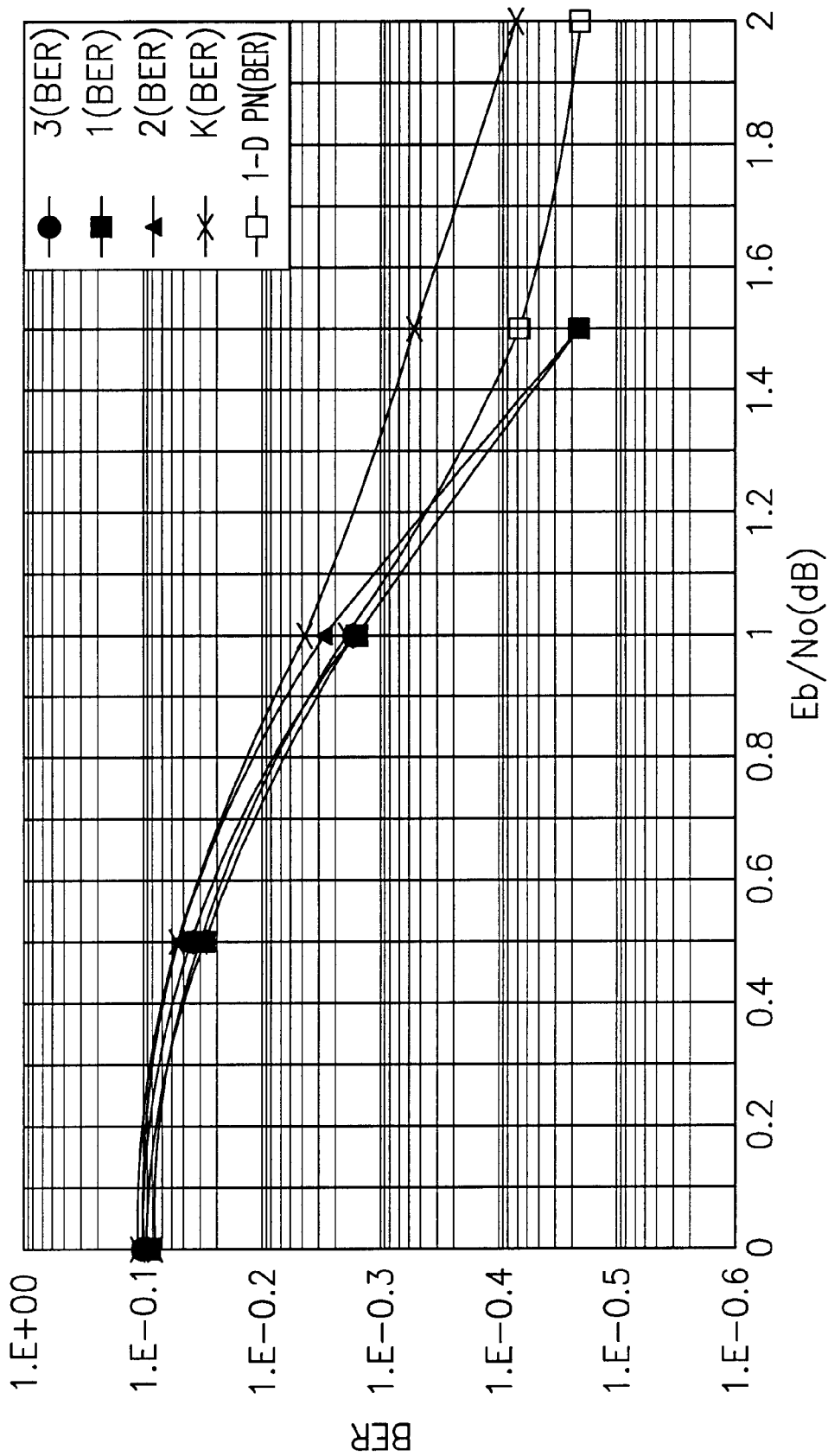
FIGS. 5A and 5B are illustrative diagrams for comparing the performance of various SCCC interleavers according to embodiments of the present invention with performance of the conventional SCCC interleaver.
Figure 5B:
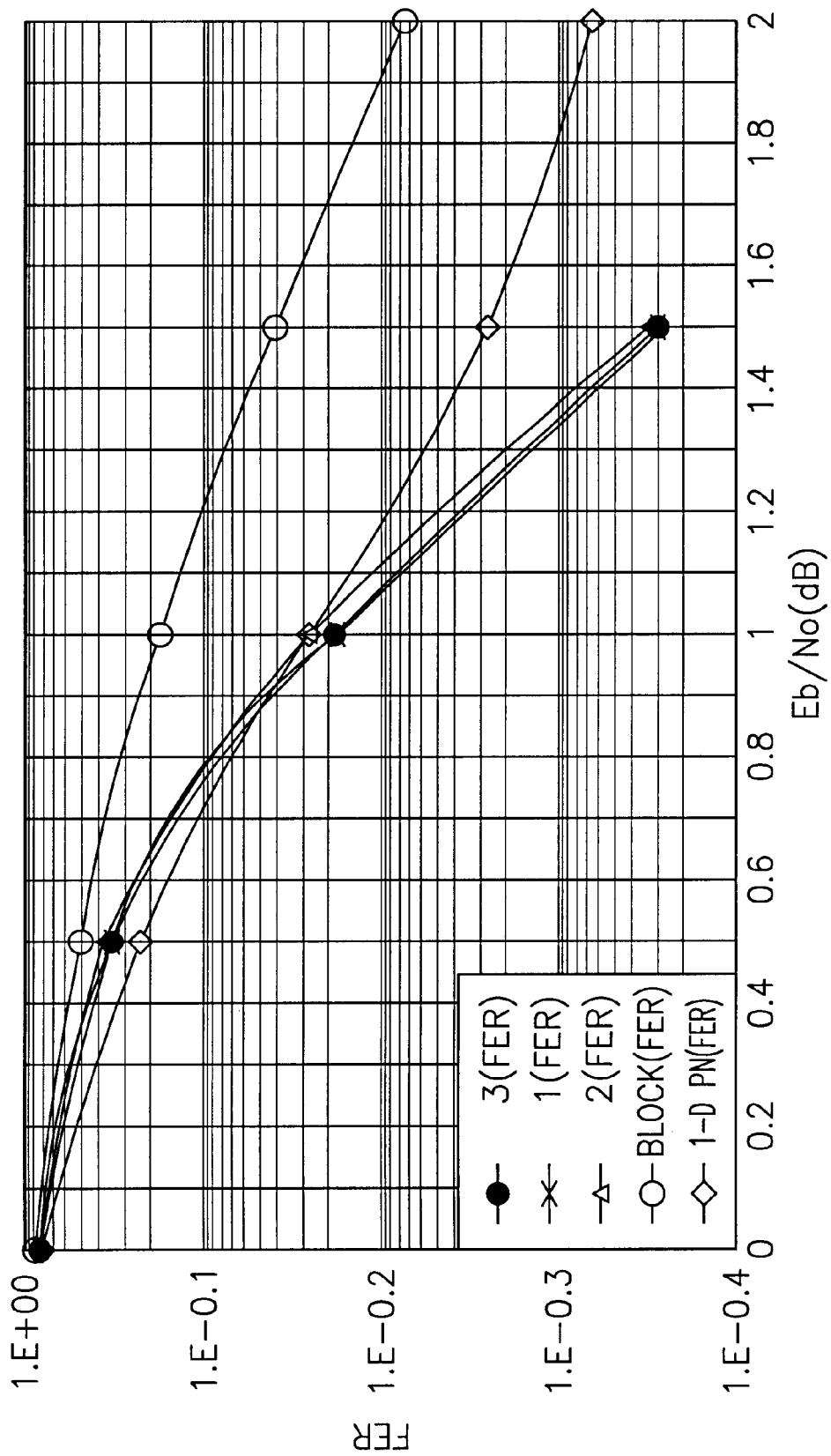

A performance comparison between the novel SCCC interleaver and the conventional SCCC interleaver is shown in FIGS. 5A and 5B. The following simulation parameters are set to make a performance comparison among 5 types of the SCCC interleavers.

Encoder: 4-state SCCC interleaver
Information Size: 640
Code Rate: R=1/3 (outer code rate=2/3, inner code rate=1/2)
Interleaver Size: (640+2)*3/2=963, where '2' is the number of tail bits for zero-terminating the outer encoder, and '3/2' is a reciprocal of the outer code rate.
Channel: AWGN (Additive White Gaussian Noise)
Decoder: Log MAP (Maximum A Posteriori) SISO (Soft-Input-Soft-Output) decoding algorithm
Interleaver
  Conventional: Block Interleaver
  Conventional: 1-D PN Interleaver
  Embodiment 1: 2-D PN Interleaver with 1 PNSR
  Embodiment 2: 2-D PN Interleaver with 2 PNSRs
  Embodiment 3: 2-D PN Interleaver with 16 PNSRs FIGS. 5A and 5B show BER/FER (Bit Error Rate/Frame Error Rate) performance according to the SNR (Signal-to-Noise Ratio). More specifically, FIGS. 5A and 5B show a performance comparison among the conventional block interleaver and 1-D PN interleaver and the novel 2-D SCCC interleavers according to respective embodiments of the present invention. It can be noted from FIGS. 5A and 5B that the novel 2-D SCCC interleavers according to embodiments of the present invention have highly improved BER/FER performance as compared with the block interleaver and the 1-D PN interleaver.

Referring to FIG. 5A, from the viewpoint of BER, Embodiments 1 to 3 have similar performance. In particular, for the required BER performance of $10^{-5}$, the three embodiments show almost the same performance. The three embodiments all show much better BER performance as compared with the 1-D PN interleaver and the block interleaver. Referring to FIG. 5B, even from the viewpoint of the FER, the three embodiments show almost the same performance, and performances of the 1-D PN interleaver and the block interleaver are degraded about 10 and 100 times, respectively, at 1.5 dB.

As described above, when the SCCC is used for the error correction code, an embodiment of the present invention can design the SCCC internal interleaver having the optimal performance and low complexity. In addition, the novel interleaver has highly improved BER/FER performance as compared with the existing block interleaver and 1-D PN interleaver.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A serial concatenated convolutional code (SCCC) encoder comprising:
  a first encoder for encoding input information to output serial coded symbols, said serial coded symbols having an effective free distance; an interleaver having a memory with m row groups and n column groups, said memory for storing said serial coded symbols in the groups, said interleaver for randomly selecting one of the m row groups, and for randomly selecting one of the symbols stored in said selected one of the m row groups so as to generate interleaved symbols; and
  a second encoder for encoding the interleaved symbols from the interleaver;
  wherein a number of the serial input symbols is k, the m row groups and the n column groups in the memory are such that m×n≧k, and m is larger than the effective free distance.

2. An interleaver in a serial concatenated convolutional code (SCCC) encoder, said SCCC encoder having a first encoder for encoding input information to output a coded symbol stream, said interleaver for interleaving said coded output stream, and a second encoder for encoding the interleaved symbol stream, said interleaver comprising:
  a row selector for selecting rows, the number of rows being set according to a size of the interleaver;
  an address generator for generating a random address of a column, the number of columns being set according to the interleaver size; and
  an address combiner for combining an output of the row selector with an output of the address generator to generate a resulting coded data stream as an interleaving address.

3. The interleaver as claimed in claim 2, wherein the address generator is a PN (Pseudo Noise) shift register for generating a PN sequence for randomizing the columns of each row.

4. The interleaver as claimed in claim 2, wherein the address generator comprises:
  a first PN (Pseudo Noise) shift register for generating a PN sequence for randomizing the columns of odd rows; and a second PN shift register for generating a PN sequence for randomizing the columns of even rows.

5. The interleaver as claimed in claim 2, wherein the address generator comprises:
a plurality of PN (Pseudo Noise) shift registers for generating unique PN sequences with different properties to randomize the columns of each row.

6. The interleaver as claimed in claim 3, wherein the number of the columns is equal to $2^n$, where n is an integer.

7. The interleaver as claimed in claim 6, wherein one address is augmented to set the number of columns to $2^n$, where n is an integer.

8. The interleaver as claimed in claim 2, wherein the address generator uses one linear recursive equation to randomize the columns of every row.

9. The interleaver as claimed in claim 2, wherein the address generator uses a first linear recursive equation to randomize the columns of odd rows, and a second linear recursive equation to randomize the columns of even rows.

10. The interleaver as claimed in claim 2, wherein the address generator uses a plurality of linear recursive equations with different properties to randomize the columns of every row.

11. The interleaver as claimed in claim 8, wherein the number of the columns is set to $2^n$, where n is an integer.

12. The interleaver as claimed in claim 11, wherein one address is augmented to set the number of the columns to $2^n$, where n is an integer.

13. The interleaver as claimed in claim 2, wherein the number of the rows is set to $2^n$, where n is an integer.

14. The interleaver as claimed in claim 13, wherein number of rows is 8, 16, or 32.

15. The interleaver as claimed in claim 2, wherein the number of the rows is set to an integer, said integer being larger than an effective free distance, wherein two coded symbols of the coded symbol stream of a first encoder have the effective free distance.

16. The interleaver as claimed in claim 2, wherein the number of the rows is set to a number corresponding to $2^n$, where n is an integer, said number $2^n$ being selected from integers larger than an effective free distance, wherein two coded symbols of the coded symbol stream of the first encoder have the effective free distance.

17. The interleaver as claimed in claim 2, wherein bit values representing the rows are bit reversed, and rows are selected according to an order of the bit reversed values.

18. An interleaving method for an interleaver in a serial concatenated convolutional code (SCCC) encoder, said SCCC encoder including a first encoder for encoding input information to output a coded symbol stream, said interleaver for interleaving the symbols stream, and a second encoder for encoding the interleaved symbol stream, the interleaving method comprising the steps of:
selecting a row, the number of rows being set according to a size of the interleaver;
generating an random address for a column, the number of columns being set according to the interleaver size; and
combining the selected row with the generated random address to generate the resulting coded data stream as an interleaving address.

19. The interleaving method as claimed in claim 18, wherein the addresses of columns of every row are randomized by one PN sequence.

20. The interleaving method as claimed in claim 18, wherein addresses of columns of odd rows are randomized using a first PN sequence and addresses of columns of even rows are randomized using a second PN sequence.

21. The interleaving method as claimed in claim 18, wherein addresses of columns of each row are randomized using a unique PN sequence for each row.

22. The interleaving method as claimed in claim 18, wherein the number of the columns is set to $2^n$, where n is an integer.

23. The interleaving method as claimed in claim 22, wherein one address is augmented to set the number of the columns to $2^n$, where n is an integer.

24. The interleaving method as claimed in claim 18, wherein addresses of columns of every row are randomized using one linear recursive equation.

25. The interleaving method as claimed in claim 24, wherein the number of the columns is set to $2^n$, where n is an integer.

26. The interleaving method as claimed in claim 25, wherein one address is augmented to set the number of the columns to $2^n$, where n is an integer.

27. The interleaving method as claimed in claim 18, wherein two different linear recursive equations are used: one to randomize addresses of columns of odd rows, and the other to randomize addresses of columns of even rows.

28. The interleaving method as claimed in claim 18, wherein a plurality of linear recursive equations are used to randomize the columns of every row.

29. The interleaving method as claimed in claim 18, wherein the number of the rows is set to $2^n$, where n is an integer.

30. The interleaving method as claimed in claim 29, wherein the number of the rows is 8, 16, or 32.

31. The interleaving method as claimed in claim 18, wherein the number of the rows is set to an integer, said integer being larger than an effective free distance, wherein two coded symbols of the coded symbol stream of the first encoder have the effective free distance.

32. The interleaving method as claimed in claim 18, wherein the number of the rows is set to a number corresponding to $2^n$, where n is an integer, said number $2^n$ being selected out of integers larger than an effective free distance, wherein two coded symbols of the coded symbol stream of the first encoder have the effective free distance.

33. The interleaving method as claimed in claim 18, wherein bit values representing the rows are bit reversed and the rows are selected according to an order of the bit reversed values.

34. An serial concatenated convolutional code (SCCC) encoder comprising:
a first encoder for encoding input information of a predetermined size, and for outputting a first symbol stream, where two coded symbols of the first symbol stream have an effective free distance;
an interleaver for writing the first symbol stream as input information of size N to specific rows and columns, and for reading from said specific rows and columns to output an interleaved symbol stream, said reading comprising selecting one row each clock cycle according to a row selecting rule, generating a column address in the selected row according to a given interleaving rule, and repeating said selecting and generating to thereby generate all the addresses; and
a second encoder for encoding the interleaved symbol stream.

35. The SCCC encoder as claimed in claim 34, wherein the number of the rows is larger than the effective free distance.

36. The SCCC encoder as claimed in claim 35, wherein the number of the rows is to $2^n$, where n is an integer.

* * * * *